US012594583B2

(12) United States Patent
Suemasa et al.

(10) Patent No.: US 12,594,583 B2
(45) Date of Patent: Apr. 7, 2026

(54) SUBSTRATE CLEANING DEVICE, SUBSTRATE PROCESSING DEVICE, AND MAINTENANCE METHOD FOR SUBSTRATE CLEANING DEVICE

(71) Applicant: EBARA CORPORATION, Tokyo (JP)

(72) Inventors: Shuichi Suemasa, Tokyo (JP); Mitsuru Miyazaki, Tokyo (JP); Shozo Takahashi, Tokyo (JP); Takuya Inoue, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 92 days.

(21) Appl. No.: 18/690,157

(22) PCT Filed: Jun. 28, 2022

(86) PCT No.: PCT/JP2022/025787
§ 371 (c)(1),
(2) Date: Mar. 7, 2024

(87) PCT Pub. No.: WO2023/037716
PCT Pub. Date: Mar. 16, 2023

(65) Prior Publication Data
US 2024/0383011 A1 Nov. 21, 2024

(30) Foreign Application Priority Data

Sep. 10, 2021 (JP) ................................. 2021-147973

(51) Int. Cl.
*B08B 1/34* (2024.01)
*B08B 1/12* (2024.01)
(Continued)

(52) U.S. Cl.
CPC .................. *B08B 1/34* (2024.01); *B08B 1/12* (2024.01); *B08B 1/20* (2024.01); *B08B 1/40* (2024.01);
(Continued)

(58) Field of Classification Search
None
See application file for complete search history.

(56) References Cited

U.S. PATENT DOCUMENTS 6,248,009 B1 6/2001 Ito et al.
2002/0139389 A1 10/2002 Treur
(Continued)

FOREIGN PATENT DOCUMENTS

CN 100375226 C 3/2008
CN 1835825 B 4/2011
(Continued)

OTHER PUBLICATIONS

International Patent Application No. PCT/JP2022/025787; Int'l Search Report dated Sep. 27, 2022; 5 pages.

*Primary Examiner* — Omair Chaudhri
(74) *Attorney, Agent, or Firm* — BakerHostetler

(57) ABSTRACT

A substrate cleaning device (31) includes a roll cleaning member (61) and a rotation holding portion (100). The rotation holding portion (100) includes a non-contact sealing portion (140) that is disposed between a bearing portion (130) and the roll cleaning member (61) to seal a gap between a shaft portion (110) and a housing portion (120). The non-contact sealing portion (140) includes a rotating portion (150) that is attached to the shaft portion (110) and has a plurality of protrusion portions (151) formed on a peripheral surface (150a) of the rotating portion (150) at intervals in an axial direction, and a fixed portion (160) that is attached to the housing portion (120), surrounds the plurality of protrusion portions (151), and has a gas supply hole (161) formed in an inner peripheral surface (160a) of the fixed portion (160) surrounding the plurality of protrusion portions (151), the gas supply hole (161) supplying a compressed gas (200) from a position inward of the protrusion portions (151) in the axial direction, which are disposed at both end portions in the axial direction, among the plurality of protrusion portions (151).

10 Claims, 10 Drawing Sheets

(51) Int. Cl.
  *B08B 1/20*    (2024.01)
  *B08B 1/40*    (2024.01)
  *B08B 5/02*    (2006.01)
  *H01L 21/67*    (2006.01)

(52) U.S. Cl.
  CPC ........ *B08B 5/023* (2013.01); *H01L 21/67046*
                (2013.01)

(56)      References Cited

U.S. PATENT DOCUMENTS

2008/0210258 A1*  9/2008  Yudovsky ................. B08B 1/34
                        134/6
2020/0188962 A1*  6/2020  Uozumi .................... B08B 3/04
2021/0362198 A1*  11/2021  Lee ........................... B08B 3/04

FOREIGN PATENT DOCUMENTS

| | | | | | |
|---|---|---|---|---|---|
| CN | 113118088 | A | * | 7/2021 | ....... H01L 21/67046 |
| JP | 2000173971 | A | * | 6/2000 | |
| JP | 2000-301079 | | | 10/2000 | |
| JP | 2005142290 | A | * | 6/2005 | |
| JP | 2007-509749 | A | | 4/2007 | |
| KR | 20070034886 | A | * | 3/2007 | .............. B08B 1/12 |
| TW | I221317 | B | | 9/2004 | |
| TW | I474875 | B | | 3/2015 | |
| WO | WO 2005-044474 | A1 | | 5/2005 | |
| WO | WO-2013034409 | A1 | * | 3/2013 | ....... H01L 21/67126 |

* cited by examiner

SUBSTRATE CLEANING DEVICE, SUBSTRATE PROCESSING DEVICE, AND MAINTENANCE METHOD FOR SUBSTRATE CLEANING DEVICE

TECHNICAL FIELD

The present invention relates to a substrate cleaning device, a substrate processing device, and a maintenance method for a substrate cleaning device.

Priority is claimed on Japanese Patent Application No. 2021-147973, filed Sep. 10, 2021, the content of which is incorporated herein by reference.

BACKGROUND ART

Patent Document 1 discloses a substrate cleaning device suitable for cleaning substrates that require a high degree of cleanliness, such as semiconductor wafers, glass substrates, and liquid crystal panels. The substrate cleaning device includes a cleaning tool (roll cleaning member) configured by attaching a cleaning member formed of a sponge, a brush, or the like to an outer surface of a hollow shaft body.

The cleaning tool is supported at both ends by a frame. On one end side of the frame, a rotation holding portion including a motor, a transmission shaft that transmits a rotation of the motor to the cleaning tool, and a bearing that supports the transmission shaft is provided. Accordingly, the cleaning tool can be rotated with the rotation of the motor to scrub a substrate with a peripheral surface of the cleaning tool.

CITATION LIST

Patent Document

[Patent Document 1]
  Japanese Unexamined Patent Application, First Publication No. 2000-301079

SUMMARY OF INVENTION

Technical Problem

In the substrate cleaning device as in the related art described above, since the substrate is scrubbed while supplying a cleaning liquid to the substrate, a contact type seal may be provided around the transmission shaft so that the cleaning liquid does not infiltrate into a motor side along the transmission shaft. However, when the contact type seal is provided, contact of the contact type seal with the transmission shaft acts as a resistance to a rotational torque of the motor. In addition, abrasive powder (particles) generated from the contact type seal may adhere to the substrate and serve as a defect source.

The present invention has been made in view of the above-described circumstances, and an object thereof is to reduce a rotational resistance of a roll cleaning member and suppress the generation of particles.

Solution to Problem

A substrate cleaning device according to an aspect of the present invention includes: a roll cleaning member configured to scrub a substrate; and a rotation holding portion configured to hold an end portion of the roll cleaning member in an axial direction, in which the rotation holding portion includes a shaft portion configured to be connected to the end portion of the roll cleaning member in the axial direction, a housing portion configured to surround the shaft portion, a bearing portion configured to be disposed inside the housing portion and to rotatably support the shaft portion, and a non-contact sealing portion configured to be disposed between the bearing portion and the roll cleaning member and to seal a gap between the shaft portion and the housing portion, and the non-contact sealing portion includes a rotating portion configured to be attached to the shaft portion and to have a plurality of protrusion portions formed on a peripheral surface of the rotating portion at intervals in the axial direction, and a fixed portion configured to be attached to the housing portion, to surround the plurality of protrusion portions, and to have a gas supply hole formed in an inner peripheral surface of the fixed portion surrounding the plurality of protrusion portions, the gas supply hole supplying a compressed gas from a position inward of the protrusion portions in the axial direction, which are disposed at both end portions in the axial direction, among the plurality of protrusion portions.

In the substrate cleaning device, the gas supply hole may supply the compressed gas from a position including a center portion of a formation region of the plurality of protrusion portions in the axial direction.

In the substrate cleaning device, the gas supply hole may be open to the inner peripheral surface of the fixed portion in a direction parallel to a tangential direction of the peripheral surface of the rotating portion.

In the substrate cleaning device, the gas supply hole may be open toward a center axis of the rotating portion.

In the substrate cleaning device, a gas exhaust hole for exhausting the compressed gas may be formed in the inner peripheral surface of the fixed portion on a side opposite to the gas supply hole.

In the substrate cleaning device, a gas exhaust hole for exhausting the compressed gas may be formed on the inner peripheral surface of the fixed portion on the same side as the gas supply hole.

In the substrate cleaning device, the fixed portion may include a first wall portion configured to be disposed closer to a roll cleaning member side than the plurality of protrusion portions in the axial direction, to extend radially inward beyond a tip of the protrusion portion disposed at an end portion on the roll cleaning member side among the plurality of protrusion portions, and to face the peripheral surface of the rotating portion with a gap, and a second wall portion configured to be disposed closer to the roll cleaning member side than the first wall portion in the axial direction, and to cover the gap between the first wall portion and the peripheral surface of the rotating portion when viewed in the axial direction.

In the substrate cleaning device, a drainage hole may be formed in the inner peripheral surface of the fixed portion between the first wall portion and the second wall portion.

A substrate processing device according to another aspect of the present invention includes: a polishing unit configured to polish a substrate; and a cleaning unit configured to clean the substrate polished in the polishing unit, in which the cleaning unit includes the substrate cleaning device described above.

A maintenance method for a substrate cleaning device according to another aspect of the present invention includes, in which the substrate cleaning device includes a roll cleaning member configured to scrub a substrate, and a rotation holding portion configured to hold an end portion of the roll cleaning member in an axial direction, the rotation holding portion includes a shaft portion configured to be connected to the end portion of the roll cleaning member in the axial direction, a housing portion configured to surround the shaft portion, a bearing portion configured to be disposed inside the housing portion and to rotatably support the shaft portion, and a non-contact sealing portion configured to be disposed between the bearing portion and the roll cleaning member to seal a gap between the shaft portion and the housing portion, and the non-contact sealing portion includes a rotating portion configured to be attached to the shaft portion and to have a plurality of protrusion portions formed on a peripheral surface of the rotating portion at intervals in the axial direction, and a fixed portion configured to be attached to the housing portion, to surround the plurality of protrusion portions, and to have a gas supply hole formed in an inner peripheral surface of the fixed portion surrounding the plurality of protrusion portions, the gas supply hole supplying a compressed gas from a position inward of the protrusion portions in the axial direction, which are disposed at both end portions in the axial direction, among the plurality of protrusion portions: performing maintenance in a state in which, after the fixed portion is removed from the housing portion, a cover surrounding the rotating portion is attached to a place from which the fixed portion is removed.

Advantageous Effects of Invention

According to the aspect of the present invention, it is possible to reduce the rotational resistance of the roll cleaning member and suppress the generation of particles.

DESCRIPTION OF EMBODIMENTS

Figure 1:
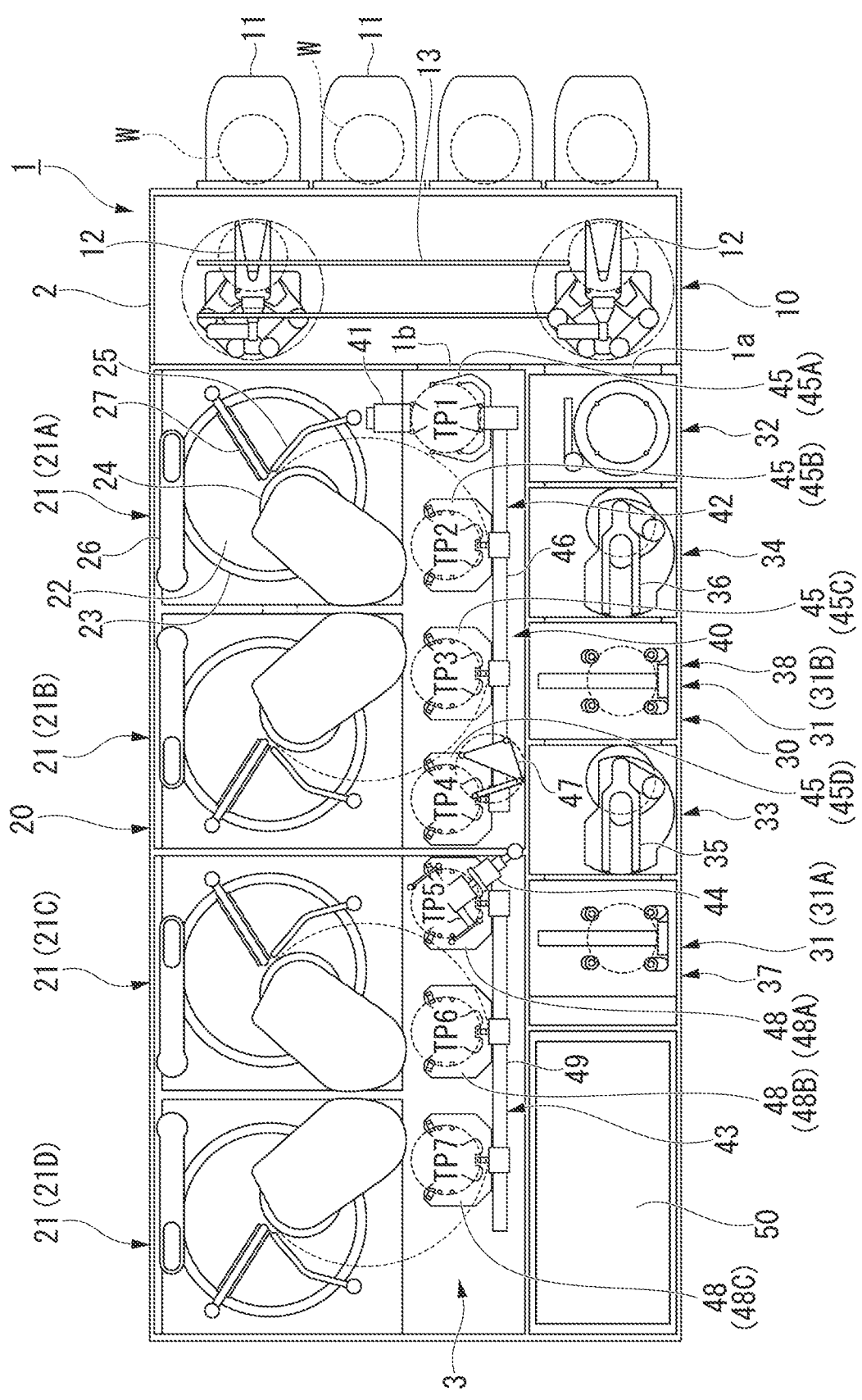
FIG. 1 is a plan view showing an overall configuration of a substrate processing device according to an embodiment.

Hereinafter, an embodiment of the present invention will be described with reference to the drawing.

FIG. 1 is a plan view showing an overall configuration of a substrate processing device 1 according to an embodiment.

The substrate processing device 1 shown in FIG. 1 is a chemical mechanical polishing (CMP) device that flattens a surface of a substrate W such as a silicon wafer. The substrate processing device 1 includes a rectangular box-shaped housing 2. The housing 2 is formed in a substantially rectangular shape in a plan view.

The housing 2 includes a substrate transport path 3 extending in a longitudinal direction at a center thereof. A loading/unloading unit 10 is disposed at one end portion of the substrate transport path 3 in the longitudinal direction. A polishing unit 20 is disposed on one side of the substrate transport path 3 in a width direction (a direction orthogonal to the longitudinal direction in a plan view), and a cleaning unit 30 is disposed on the other side thereof. On the substrate transport path 3, a substrate transporting unit 40 that transports the substrate W. In addition, the substrate processing device 1 includes a control unit 50 (control panel) that generally controls operations of the loading/unloading unit 10, the polishing unit 20, the cleaning unit 30, and the substrate transporting unit 40.

The loading/unloading unit 10 includes front loading portions 11 that accommodate the substrate W. A plurality of the front loading portions 11 are provided on a side surface on one side of the housing 2 in the longitudinal direction. The plurality of front loading portions 11 are arranged in the width direction of the housing 2. The front loading portion 11 is equipped with, for example, an open cassette, a standard manufacturing interface (SMIF) pod, or a front opening unified pod (FOUP). The SMIF and FOUP are sealed containers that internally accommodate a cassette of the substrates W and are covered with a partition wall, and are capable of maintaining an environment independent of an external space.

In addition, the loading/unloading unit 10 includes two transporting robots 12 that load and unload the substrate W from the front loading portion 11, and a traveling mechanism 13 that causes each of the transporting robots 12 to travel along a row of the front loading portions 11. Each of the transporting robots 12 includes two upper and lower hands, which are used properly before and after processing of the substrate W. For example, the upper hand is used when the substrate W is returned to the front loading portion 11, and the lower hand is used when the substrate W before being processed is taken out from the front loading portion 11.

The polishing unit 20 includes a plurality of substrate polishing devices 21 (21A, 21B, 21C, and 21D) that polish (flatten) the substrate W. The plurality of substrate polishing devices 21 are arranged in a longitudinal direction of the substrate transport path 3. The substrate polishing device 21 includes a polishing table 23 that rotates a polishing pad 22 having a polishing surface, a top ring 24 for holding the substrate W and polishing the substrate W while pressing the substrate W against the polishing pad 22 on the polishing table 23, a polishing liquid supply nozzle 25 for supplying a polishing liquid or a dressing liquid (for example, pure water) to the polishing pad 22, a dresser 26 for dressing the polishing surface of the polishing pad 22, an atomizer 27 that sprays a mixed fluid of a liquid (for example, pure water) and a gas (for example, nitrogen gas) or a liquid (for example, pure water) in the form of mist onto the polishing surface.

In the substrate polishing device 21, the substrate W is pressed against the polishing pad 22 by the top ring 24 while supplying the polishing liquid from the polishing liquid supply nozzle 25 onto the polishing pad 22, and the top ring 24 and the polishing table 23 are further moved relative to each other, whereby the substrate W is polished and a surface thereof is flattened. In the dresser 26, hard particles such as diamond particles or ceramic particles are fixed to a rotating portion of a tip end of the dresser 26 that comes into contact with the polishing pad 22, and the dresser 26 oscillates while rotating the rotating portion, whereby the entire polishing surface of the polishing pad 22 is uniformly dressed and a flat polishing surface is formed. The atomizer 27 washes away polishing waste, abrasives, and the like remaining on the polishing surface of the polishing pad 22 with a high-pressure fluid, whereby purifying of the polishing surface and dressing of the polishing surface by the dresser 26 that is in mechanical contact, that is, regeneration of the polishing surface are achieved.

The cleaning unit 30 includes a plurality of substrate cleaning devices 31 (31A and 31B) that clean the substrate W and a substrate drying device 32 that dries the cleaned substrate W. The plurality of substrate cleaning devices 31 and substrate drying device 32 are arranged in the longitudinal direction of the substrate transport path 3. The substrate cleaning device 31A is provided in a first substrate cleaning tank 37. In addition, the substrate cleaning device 31B is provided in a second substrate cleaning tank 38.

A first transport chamber 33 is provided between the first substrate cleaning tank 37 and the second substrate cleaning tank 38. The first transport chamber 33 is provided with a transporting robot 35 that transports the substrate W between the substrate transporting unit 40, the substrate cleaning device 31A, and the substrate cleaning device 31B. In addition, a second transport chamber 34 is provided between the substrate cleaning device 31B and the substrate drying device 32. The second transport chamber 34 is provided with a transporting robot 36 that transports the substrate W between the substrate cleaning device 31B and the substrate drying device 32.

The substrate cleaning device 31A includes a roll sponge type cleaning module, which will be described later, and primarily cleans the substrate W. Furthermore, the substrate cleaning device 31B also includes a roll sponge type cleaning module, and secondarily cleans the substrate W. The substrate cleaning device 31A and the substrate cleaning device 31B may be cleaning modules of the same type or of different types, and may be, for example, pencil sponge type cleaning modules or two-fluid jet type cleaning modules. The substrate drying device 32 includes a drying module that performs iso-propyl alcohol (IPA) drying such as Rotagoni drying (ROTAGONI; trademark). After the drying, a shutter 1a provided on a partition wall between the substrate drying device 32 and the loading/unloading unit 10 is opened and the substrate W is taken out from the substrate drying device 32 by the transporting robot 12.

The substrate transporting unit 40 includes a lifter 41, a first linear transporter 42, a second linear transporter 43, and a swing transporter 44. On the substrate transport path 3, a first transport position TP1, a second transport position TP2, a third transport position TP3, a fourth transport position TP4, a fifth transport position TP5, a sixth transport position TP6, and a seventh transport position TP7 are set in order from a loading/unloading unit 10 side.

The lifter 41 is a mechanism that vertically transports the substrate W at the first transport position TP1. The lifter 41 receives the substrate W from the transporting robot 12 of the loading/unloading unit 10 at the first transport position TP1. In addition, the lifter 41 delivers the substrate W received from the transporting robot 12 to the first linear transporter 42. A shutter 1b is provided on a partition wall between the first transport position TP1 and the loading/unloading unit 10, and when the substrate W is transported, the shutter 1b is opened and the substrate W is delivered from the transporting robot 12 to the lifter 41.

The first linear transporter 42 is a mechanism that transports the substrate W between the first transport position TP1, the second transport position TP2, the third transport position TP3, and the fourth transport position TP4. The first linear transporter 42 includes a plurality of transporting hands 45 (45A, 45B, 45C, and 45D) and a linear guide mechanism 46 that moves each of the transporting hands 45 in a horizontal direction at a plurality of heights. The transporting hand 45A is moved between the first transport position TP1 and the fourth transport position TP4 by the linear guide mechanism 46. The transporting hand 45A is a pass hand for receiving the substrate W from the lifter 41 and delivering the substrate W to the second linear transporter 43. The transporting hand 45A is not provided with an elevation drive unit.

The transporting hand 45B is moved between the first transport position TP1 and the second transport position TP2 by the linear guide mechanism 46. The transporting hand 45B receives the substrate W from the lifter 41 at the first transport position TP1, and delivers the substrate W to the substrate polishing device 21A at the second transport position TP2. The transporting hand 45B is provided with an elevation drive unit, is raised when the substrate W is delivered to the top ring 24 of the substrate polishing device 21A, and is lowered after the substrate W is delivered to the top ring 24. The same elevation drive unit is also provided in the transporting hand 45C and the transporting hand 45D.

The transporting hand 45C is moved between the first transport position TP1 and the third transport position TP3 by the linear guide mechanism 46. The transporting hand 45C receives the substrate W from the lifter 41 at the first transport position TP1, and delivers the substrate W to the substrate polishing device 21B at the third transport position TP3. In addition, the transporting hand 45C also functions as an access hand that receives the substrate W from the top ring 24 of the substrate polishing device 21A at the second transport position TP2 and delivers the substrate W to the substrate polishing device 21B at the third transport position TP3.

The transporting hand 45D is moved between the second transport position TP2 and the fourth transport position TP4 by the linear guide mechanism 46. The transporting hand 45D functions as an access hand for receiving the substrate W from the top ring 24 of the substrate polishing device 21A or the substrate polishing device 21B at the second transport position TP2 or the third transport position TP3, and delivering the substrate W to the swing transporter 44 at the fourth transport position TP4.

The swing transporter 44 has a hand that is movable between the fourth transport position TP4 and the fifth transport position TP5, and delivers the substrate W from the first linear transporter 42 to the second linear transporter 43. In addition, the swing transporter 44 delivers the substrate W polished in the polishing unit 20 to the cleaning unit 30. A temporary placing stand 47 for the substrate W is provided on a side of the swing transporter 44. The swing transporter 44 inverts the substrate W received at the fourth transport position TP4 or the fifth transport position TP5 and places the substrate W on the temporary placing stand 47. The substrate W placed on the temporary placing stand 47 is transported to the first transport chamber 33 by the transporting robot 35 of the cleaning unit 30.

The second linear transporter 43 is a mechanism that transports the substrate W between the fifth transport position TP5, the sixth transport position TP6, and the seventh transport position TP7. The second linear transporter 43 includes a plurality of transporting hands 48 (48A, 48B, and 48C) and a linear guide mechanism 49 that moves each of the transporting hands 45 in the horizontal direction at a plurality of heights. The transporting hand 48A is moved between the fifth transport position TP5 and the sixth transport position TP6 by the linear guide mechanism 49. The transporting hand 48A functions as an access hand that receives the substrate W from the swing transporter 44 and delivers the substrate W to the substrate polishing device 21C.

The transporting hand 48B moves between the sixth transport position TP6 and the seventh transport position TP7. The transporting hand 48B functions as an access hand for receiving the substrate W from the substrate polishing device 21C and delivering the substrate W to the substrate polishing device 21D. The transporting hand 48C moves between the seventh transport position TP7 and the fifth transport position TP5. The transporting hand 48C functions as an access hand for receiving the substrate W from the top ring 24 of the substrate polishing device 21C or the substrate polishing device 21D at the sixth transport position TP6 or the seventh transport position TP7, and delivering the substrate W to the swing transporter 44 at the fifth transport position TP5. Although description is omitted, an operation of the transporting hand 48 when delivering the substrate W is the same as the operation of the first linear transporter 42 described above.

Figure 2:
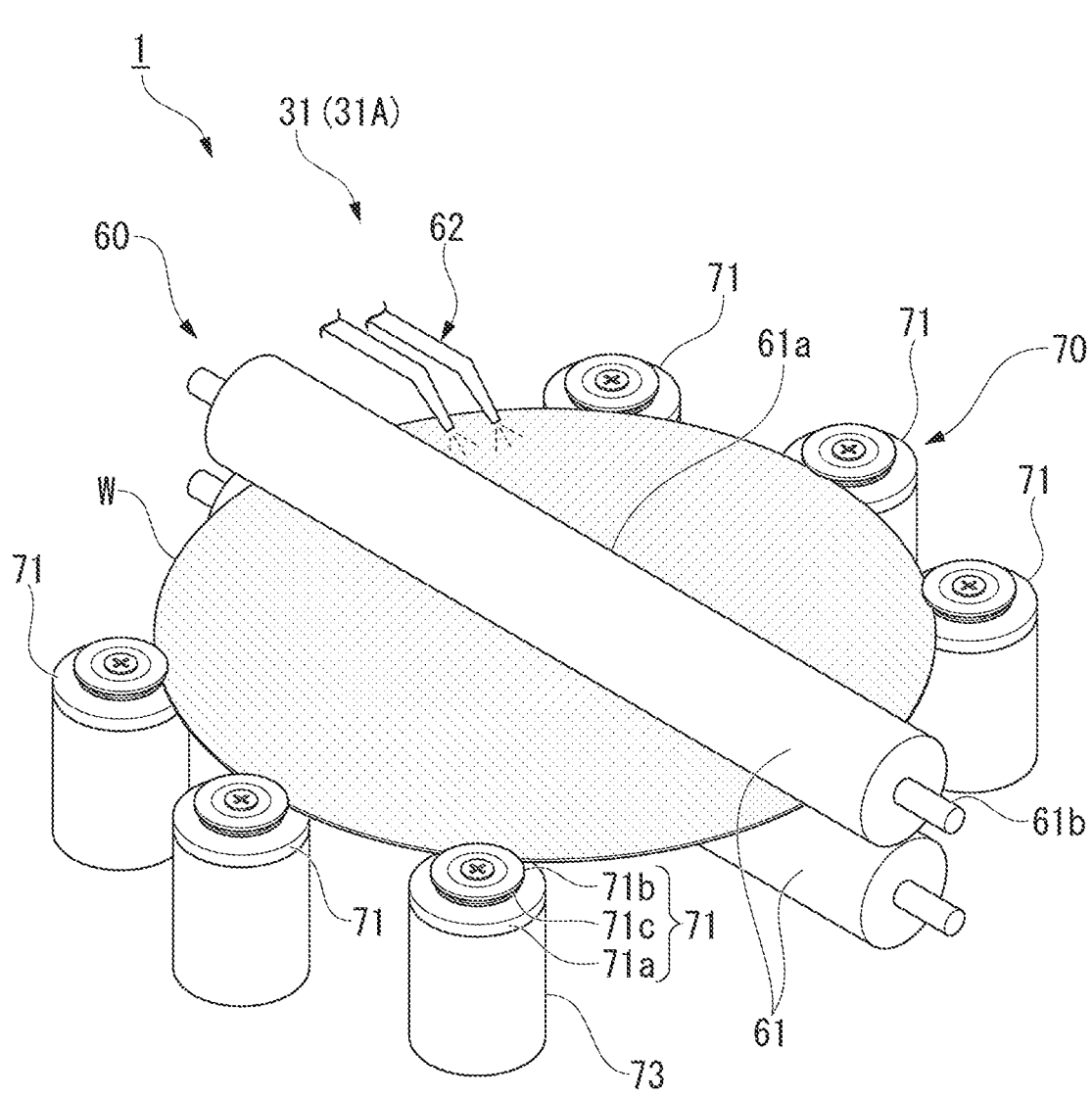
FIG. 2 is a perspective view showing a configuration of a substrate cleaning device according to the embodiment.

FIG. 2 is a perspective view showing a configuration of the substrate cleaning device 31 according to the embodiment.

As shown in FIG. 2, the substrate cleaning device 31 includes a substrate cleaning portion 60 that cleans the substrate W, and a substrate holding and rotating portion 70 that holds and rotates the substrate W. The substrate cleaning portion 60 includes roll cleaning members 61 that rotate in contact with the substrate W, and a liquid supply nozzle 62 that supplies a liquid to the substrate W.

The roll cleaning member 61 includes a tubular roll portion 61a and a shaft portion 61b that supports the roll portion 61a. The roll portion 61a is formed of, for example, a sponge made of polyvinyl alcohol (PVA), or a urethane sponge. A pair of the roll cleaning members 61 are provided to respectively come into contact with a surface (polished surface) of the substrate W and a rear surface of the substrate W. The pair of roll cleaning members 61 are connected to an electric drive unit such as a motor to rotate.

The upper roll cleaning member 61 that comes into contact with the surface of the substrate W can be moved vertically by an air drive unit such as an air cylinder. The lower roll cleaning member 61 that comes into contact with the rear surface of the substrate W may be held at a constant height. The liquid supply nozzle 62 supplies a cleaning liquid, pure water, or the like to the substrate W. As the cleaning liquid, SC1 (ammonia/hydrogen peroxide mixed aqueous solution) or the like can be used.

The substrate holding and rotating portion 70 includes a plurality of (six in the present embodiment) substrate holding rollers 71 that rotate the substrate W. The substrate holding roller 71 has a groove shape for holding a peripheral edge portion of the substrate W. Specifically, the substrate holding roller 71 includes a roller lower portion 71a that faces a rear surface of the peripheral edge portion of the substrate W, a roller upper portion 71b that faces a surface of the peripheral edge portion of the substrate W, and a clamping groove 71c that is provided between the roller lower portion 71a and the roller upper portion 71b and into which the peripheral edge portion of the substrate W is inserted.

The substrate holding roller 71 is provided at an upper end of a support column portion 73. The substrate holding roller 71 is configured to be horizontally rotatable by an electric driving unit such as a motor (not shown) provided in the support column portion 73. In addition, the substrate holding roller 71 is configured to be vertically movable by an air drive unit such as an air cylinder (not shown) provided in the support column portion 73.

When setting the substrate W as shown in FIG. 2, first, the upper roll cleaning member 61 and the plurality of substrate holding rollers 71 are raised. Next, the substrate W is held in a horizontal posture by the plurality of substrate holding rollers 71 that have been raised. Thereafter, the substrate holding roller 71 is lowered until the rear surface of the substrate W comes into contact with the lower roll cleaning member 61. Last, the upper roll cleaning member 61 is lowered to come into contact with the surface of the substrate W.

After the substrate W is set in this manner, the pair of roll cleaning members 61 are rotated while the substrate W is rotated by the substrate holding roller 71, thereby removing foreign matter (fine particles) adhering to the surface and the rear surface of the substrate W. In a case of wet cleaning, the cleaning liquid and/or pure water is supplied to the surface of the substrate W from a nozzle (not shown), and the substrate W is scrubbed by the pair of roll cleaning members 61.

Figure 3:
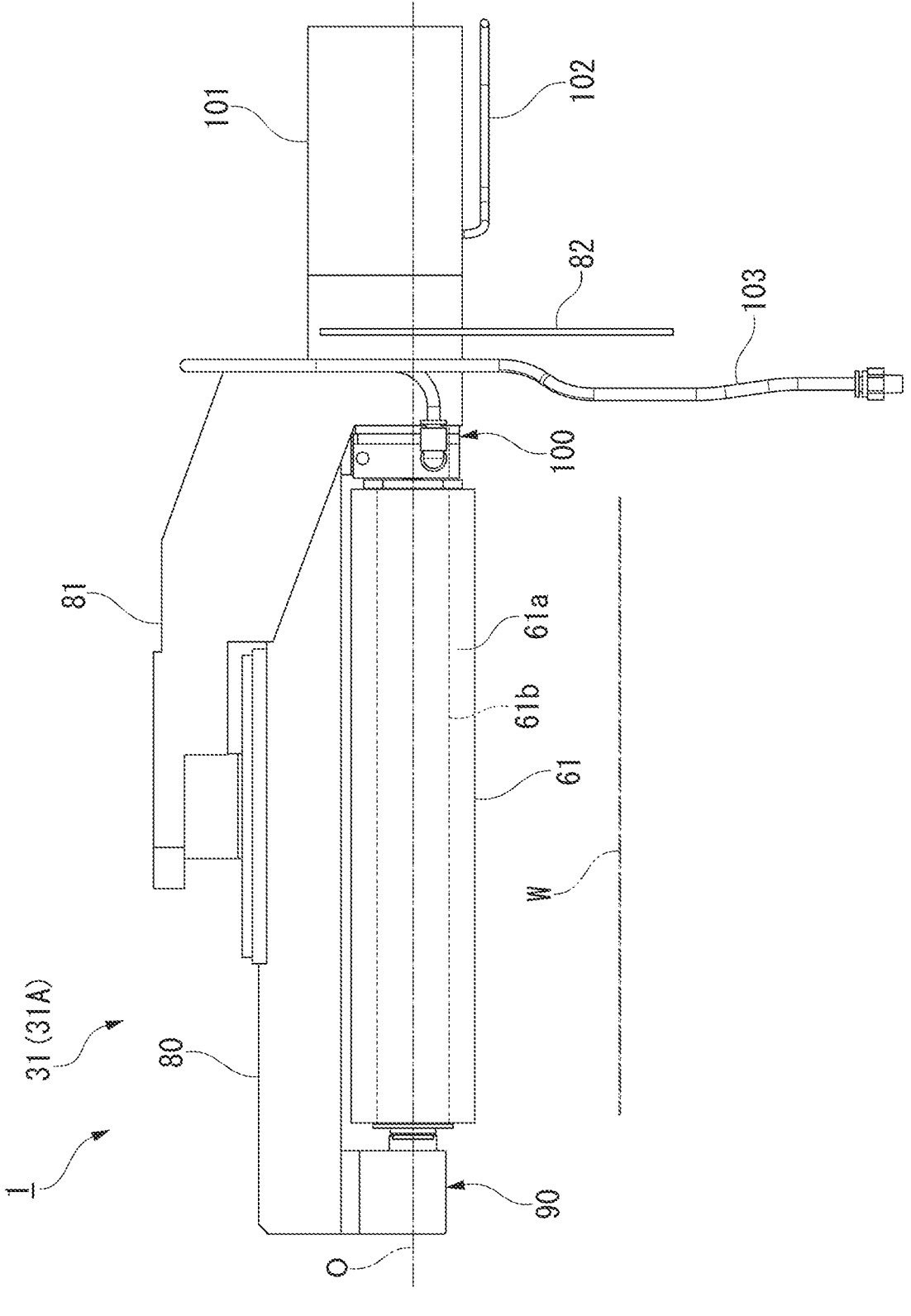
FIG. 3 is a front view showing a holding structure of a roll cleaning member according to the embodiment.
Figure 4:
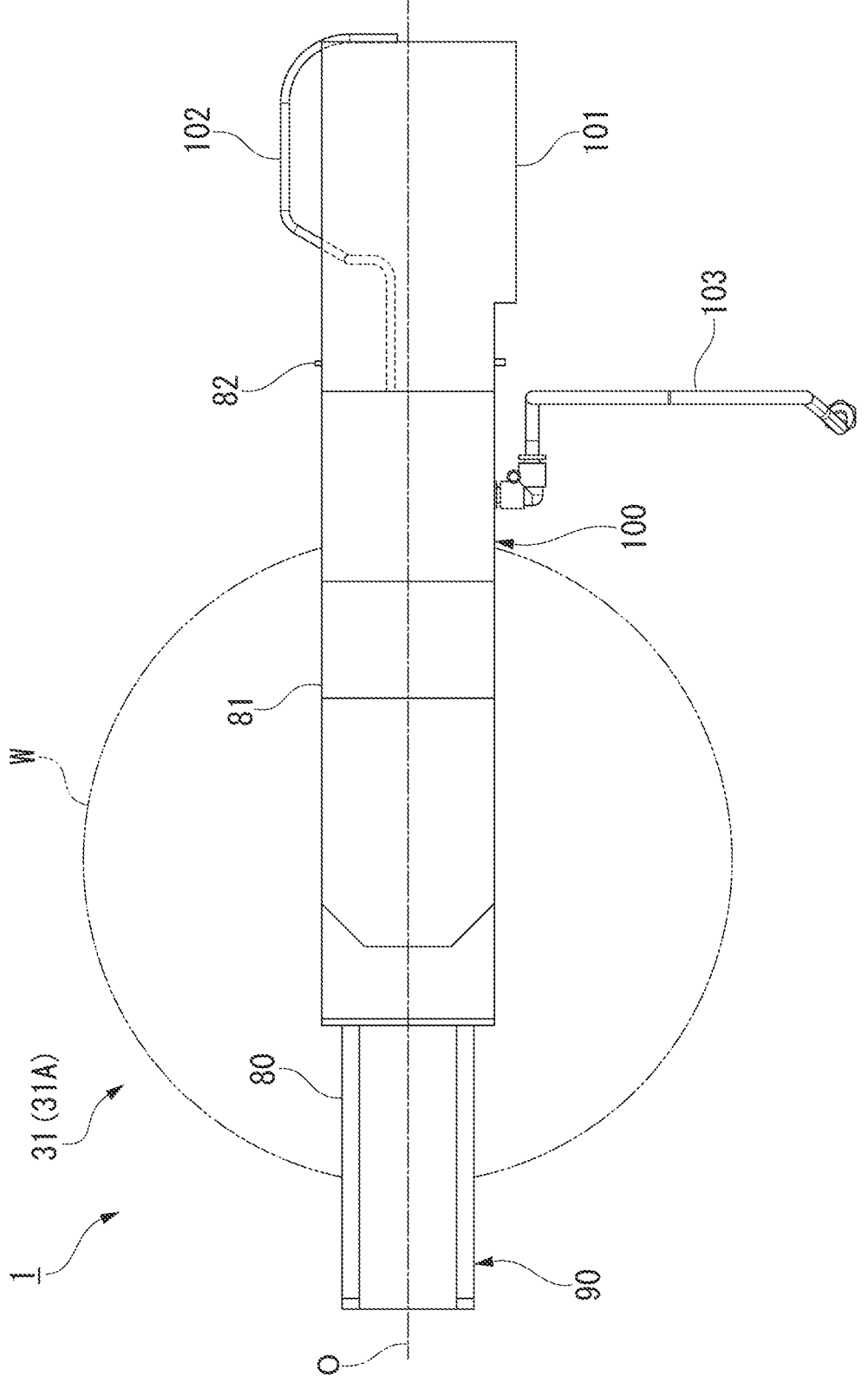
FIG. 4 is a plan view showing the holding structure of the roll cleaning member according to the embodiment.

FIG. 3 is a front view showing a holding structure of the roll cleaning member 61 according to the embodiment. FIG. 4 is a plan view showing the holding structure of the roll cleaning member 61 according to the embodiment.

In the following description, the holding structure of the roll cleaning member 61 disposed above the substrate W will be described. The holding structure of the roll cleaning member 61 disposed below the substrate W is the same as the holding structure of the roll cleaning member 61 disposed above the substrate W. The description of the holding structure of the roll cleaning member 61 disposed below the substrate W will overlap the description of the holding structure of the roll cleaning member 61 disposed above the substrate W and thus will be omitted.

In addition, in the following description, a positional relationship of each member may be described based on a center axis O of the roll cleaning member 61. A direction in which the center axis O of the roll cleaning member 61 extends is referred to as an axial direction. A direction orthogonal to the center axis O of the roll cleaning member 61 is referred to as a radial direction. A direction around the center axis O of the roll cleaning member 61 is referred to as a circumferential direction.

As shown in FIG. 3, the roll cleaning member 61 is supported by a holder 80. An arm 81 is connected to a center of an upper portion of the holder 80. The arm 81 is attached to a movement mechanism (not shown) via an attachment plate 82 to be raised, lowered, and moved horizontally. The holder 80 is provided with rotation holding portions 90 and 100 that rotatably support both end portions of the roll cleaning member 61 in the axial direction.

The rotation holding portion 90 includes a spring portion (not shown) that biases the roll cleaning member 61 toward the rotation holding portion 100 in the axial direction, and a cleaning liquid supply portion (not shown) that supplies the cleaning liquid into the hollow shaft portion 61b from the end portion of the roll cleaning member 61. The cleaning liquid supplied into the shaft portion 61b seeps through an opening of a peripheral surface of the shaft portion 61b and wets the roll portion 61a attached to the peripheral surface.

The rotation holding portion 100 is provided with a motor 101, and a rotational torque of the motor 101 is transmitted to the end portion of the roll cleaning member 61 to rotate the roll cleaning member 61. As shown in FIG. 4, a gas supply pipe 102 that supplies a compressed gas and a gas exhaust pipe 103 that exhausts the supplied compressed gas are connected to the rotation holding portion 100.

The gas supply pipe 102 and the gas exhaust pipe 103 are connected to a non-contact sealing portion 140 (see FIGS. 5 and 6, which will be described later) provided in the rotation holding portion 100. As the compressed gas, nitrogen gas can be suitably used, but an inert gas other than nitrogen gas or other gases may also be used.

Figure 5:
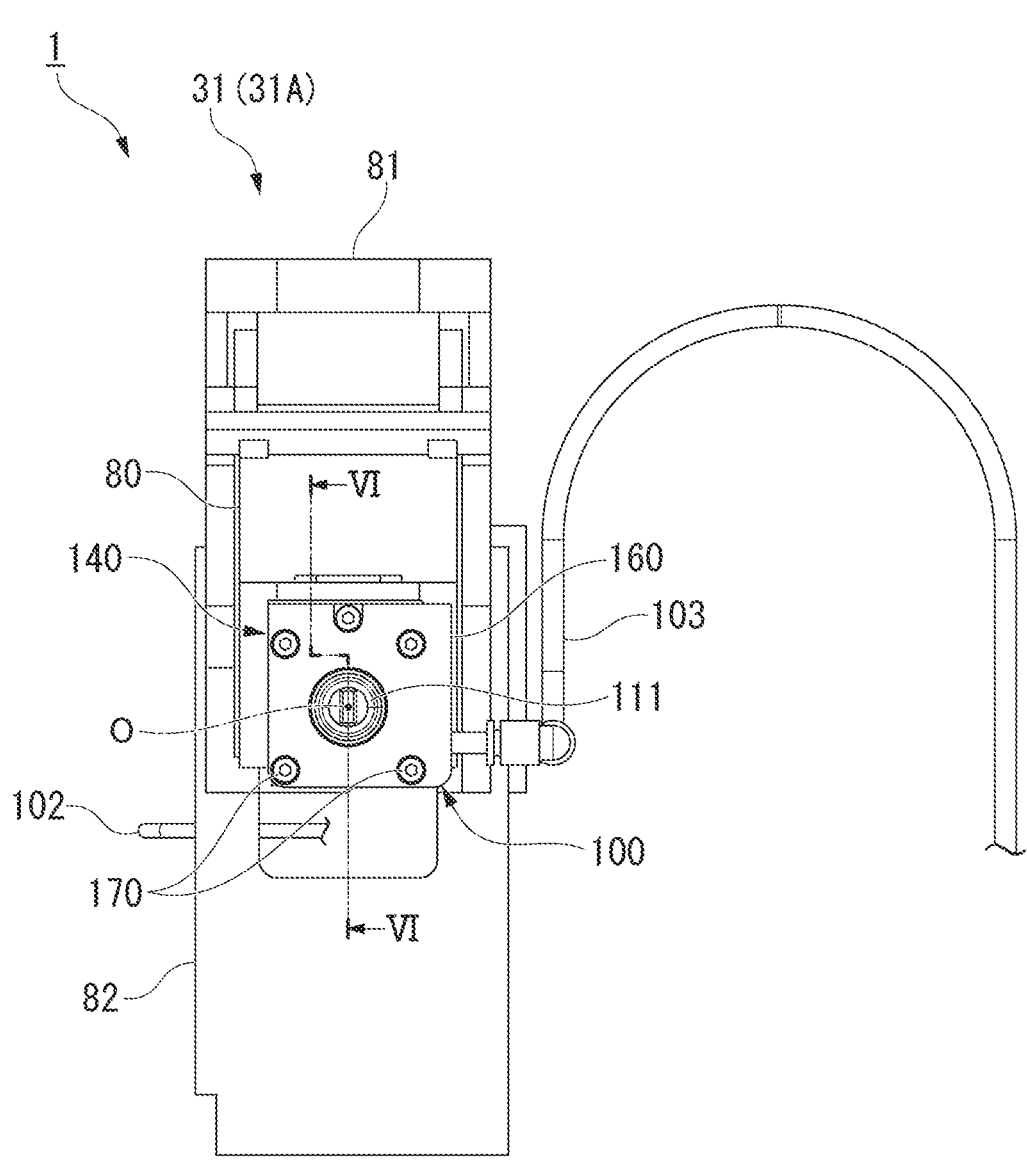
FIG. 5 is a view of a rotation holding portion according to the embodiment viewed in an axial direction.
Figure 6:
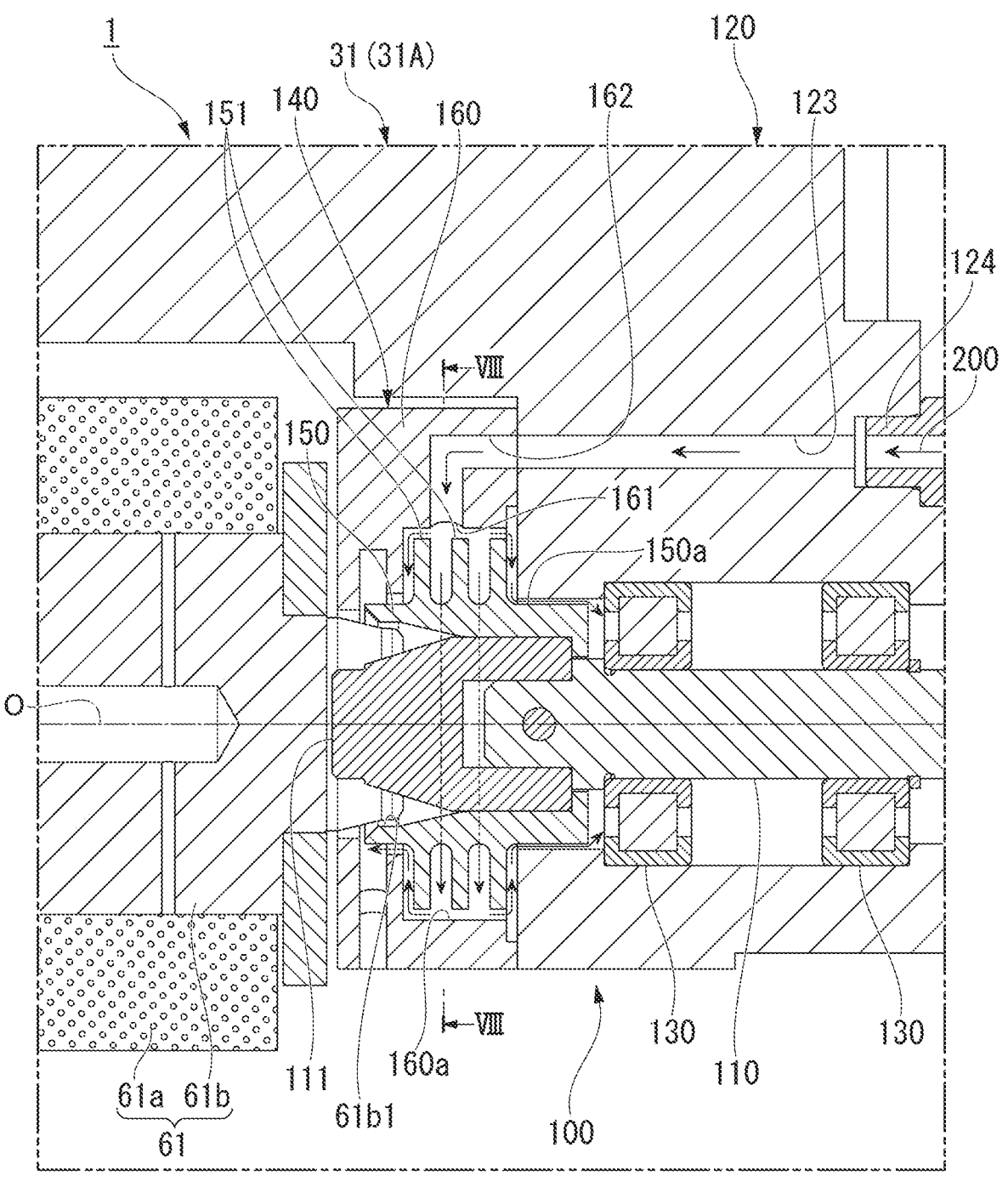
FIG. 6 is a cross-sectional view taken along line VI-VI shown in FIG. 5.

FIG. 5 is a view of the rotation holding portion 100 according to the embodiment viewed in the axial direction. FIG. 6 is a cross-sectional view taken along line VI-VI shown in FIG. 5.

As shown in FIG. 6, the rotation holding portion 100 includes a shaft portion 110 connected to the end portion of the roll cleaning member 61 in the axial direction, a housing portion 120 surrounding the shaft portion 110, a bearing portion 130 that is disposed inside the housing portion 120 and rotatably supports the shaft portion 110, and a non-contact sealing portion 140 that is disposed between the bearing portion 130 and the roll cleaning member 61 to seal a gap between the shaft portion 110 and the housing portion 120.

The shaft portion 110 includes a shaft connection portion 111 at an end portion in the axial direction on a roll cleaning member 61 side. The shaft connection portion 111 is connected to the shaft portion 61*b* of the roll cleaning member 61. A slit is formed in an end portion 61*b*1 of the shaft portion 61*b*. The shaft connection portion 111 includes a projection portion (minus type projection) that engages with the slit of the shaft portion 61*b*, and is configured to transmit a rotational torque to the shaft portion 61*b*.

An end portion of the shaft portion 110 in the axial direction on a side opposite to the roll cleaning member 61 side (motor 101 side) is connected to an output shaft (not shown) of the motor 101 via a coupling (not shown).

The bearing portion 130 is disposed between the shaft connection portion 111 and the coupling (not shown), and rotatably supports the shaft portion 110. A pair of bearing portions 130 are provided with a gap in the axial direction.

The housing portion 120 has a through-hole portion that passes through the housing portion 120 in the axial direction, and accommodates the shaft portion 110 and the bearing portions 130 in the through-hole portion.

A gas flow path 123 for the compressed gas 200 is formed in the housing portion 120. The gas flow path 123 is formed to pass through the housing portion 120 in the axial direction. In addition, an O-ring (not shown) may be disposed in a gap between the housing portion 120 and a fixed portion 160 of the non-contact sealing portion 140, which will be described later, to connect the gas flow path 123 of the housing portion 120 and a gas flow path 162 of the non-contact sealing portion 140 to each other.

One end of the gas flow path 123 is open to the housing portion 120, and a connection port 124 for connection to the gas supply pipe 102 shown in FIG. 4 and the like described above is mounted in the opening.

The non-contact sealing portion 140 includes a rotating portion 150 attached to the shaft portion 110 and the fixed portion 160 that is attached to the housing portion 120 and surrounds the rotating portion 150 with a gap. A gas supply hole 161 is formed in an inner peripheral surface 160*a* of the fixed portion 160 that surrounds the rotating portion 150.

The gas supply hole 161 communicates with the other end of the gas flow path 123 via the gas flow path 162.

Figure 7:
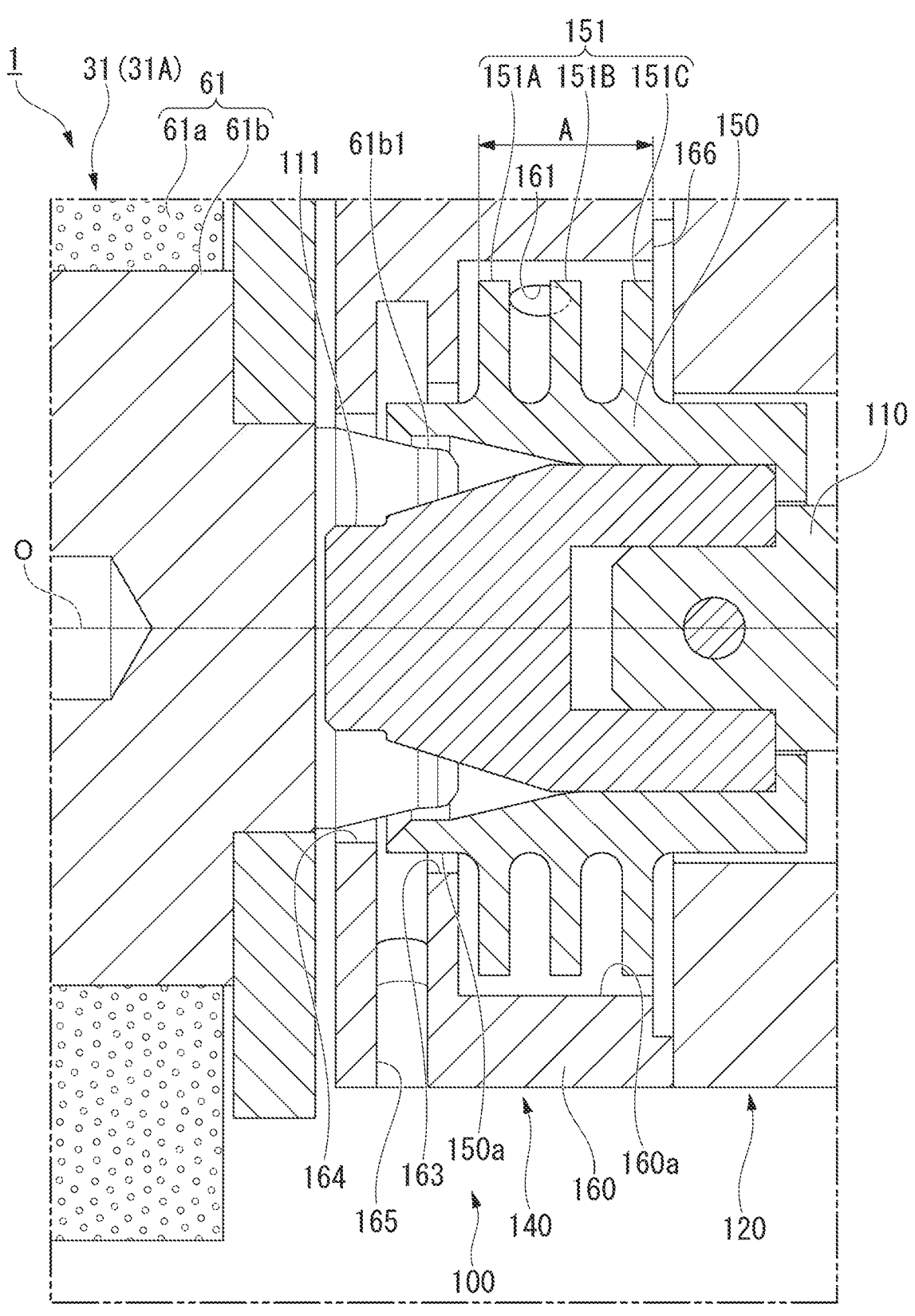
FIG. 7 is an enlarged cross-sectional view showing a configuration of a non-contact sealing portion according to the embodiment.
Figure 8:
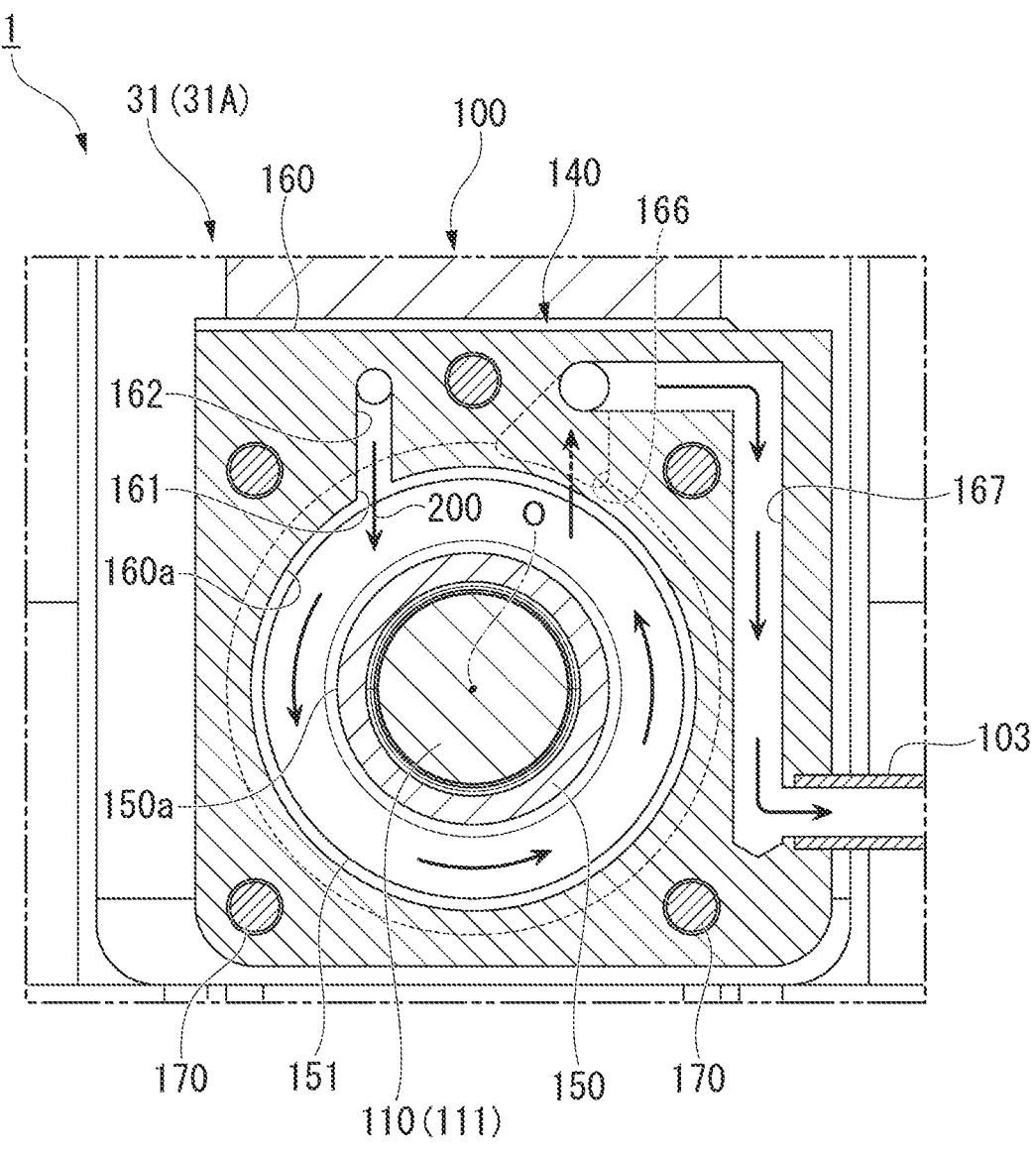
FIG. 8 is a cross-sectional view taken along line VIII-VIII shown in FIG. 6.

FIG. 7 is an enlarged cross-sectional view showing a configuration of the non-contact sealing portion 140 according to the embodiment. FIG. 8 is a cross-sectional view taken along line VIII-VIII shown in FIG. 6.

As shown in FIG. 7, the rotating portion 150 is formed in a substantially tubular shape and is mounted to a periphery of the shaft connection portion 111 of the shaft portion 110. A plurality of protrusion portions 151 are formed on a peripheral surface 150*a* of the rotating portion 150 at intervals in the axial direction.

The protrusion portion 151 is formed in a disk shape extending in the radial direction from the peripheral surface 150*a* of the rotating portion 150. Three protrusion portions 151A, 151B, and 151C are formed in the rotating portion 150 of the present embodiment. The number of protrusion portions 151 is not particularly limited, and may be two or four or more.

The fixed portion 160 surrounds a plurality of the protrusion portions 151, and the gas supply hole 161 is formed in the inner peripheral surface 160*a* that surrounds the plurality of protrusion portions 151. The gas supply hole 161 is formed so that the compressed gas 200 is supplied from a position inward of the protrusion portions 151A and 151C in the axial direction which are disposed at both end portions in the axial direction, among the plurality of protrusion portions 151. In addition, the gas supply hole 161 is formed so that the compressed gas 200 is supplied from a position including a center portion of a formation region A of the plurality of protrusion portions 151 in the axial direction.

In addition, the formation region A of the plurality of protrusion portions 151 refers to a region from an outer surface of one side (protrusion portion 151A) in the axial direction to an outer surface of the other surface (protrusion portion 151C) in the axial direction among the protrusion portions disposed at both end portions of the plurality of protrusion portions 151. In addition, the center portion of the formation region A refers to a middle region when the formation region A is divided into three equal parts in the axial direction. In addition, the center portion of the formation region A preferably refers to a center region when the formation region A is divided into five equal parts in the axial direction.

The gas supply hole 161 may be formed to include a center position when the formation region A is divided into two equal parts in the axial direction. In addition, in the gas supply hole 161, a center position of the gas supply hole 161 may coincide with the center position when the formation region A is divided into two equal parts in the axial direction.

As shown in FIG. 8, the gas supply hole 161 is open to the inner peripheral surface 160*a* of the fixed portion 160 in a direction parallel to a tangential direction of the peripheral surface 150*a* of the rotating portion 150. Accordingly, the compressed gas 200 can flow around the rotating portion 150 in a circumferential manner. In the inner peripheral surface 160*a* of the fixed portion 160, a gas exhaust hole 166 for exhausting the compressed gas 200 is formed on the same upper side as the gas supply hole 161. Accordingly, the compressed gas 200 flowing around the rotating portion 150 in a circumferential manner can be easily discharged from the gas exhaust hole 166.

As shown in FIG. 7, the gas exhaust hole 166 is formed in an end surface of the fixed portion 160 that is in contact with the housing portion 120. Accordingly, it is possible to prevent foreign matter generated from the bearing portion 130 from flowing out to an inside of the non-contact sealing portion 140 or to the roll cleaning member 61 side. As shown in FIG. 8, the gas exhaust hole 166 communicates with a gas exhaust flow path 167. The gas exhaust flow path 167 is open on a side surface of the fixed portion 160 and is connected to the gas exhaust pipe 103 (see FIGS. 3 to 5) described above.

Returning to FIG. 7, the fixed portion 160 includes a first wall portion 163 disposed closer to the roll cleaning member 61 side than the plurality of protrusion portions 151 in the axial direction, and a second wall portion 164 disposed closer to the roll cleaning member 61 side than the first wall portion 163 in the axial direction. The first wall portion 163 extends radially inward beyond a tip of the protrusion portion 151A disposed at the end portion on the roll cleaning member 61 side among the plurality of protrusion portions 151, and faces the peripheral surface 150a of the rotating portion 150 with a gap. Accordingly, a curved gap (labyrinth) is formed between the first wall portion 163 and the protrusion portion 151A.

The second wall portion 164 extends radially inward beyond the first wall portion 163. Furthermore, the second wall portion 164 extends radially inward beyond the peripheral surface 150a of the rotating portion 150. The second wall portion 164 covers the gap between the first wall portion 163 and the peripheral surface 150a of the rotating portion 150 when viewed in the axial direction. Accordingly, it is possible to prevent droplets from the roll cleaning member 61 side from infiltrating into the labyrinth through the gap between the first wall portion 163 and the peripheral surface 150a of the rotating portion 150. Furthermore, a drainage hole 165 is formed between the first wall portion 163 and the second wall portion 164 in the inner peripheral surface 160a of the fixed portion 160. Accordingly, even if several droplets of a liquid ride over the second wall portion 164, the liquid can be discharged to the outside from the drainage hole 165 in a bottom portion before reaching the first wall portion 163.

According to the non-contact sealing portion 140 having the above-described configuration, as shown in FIG. 6, the gas supply hole 161 that supplies the compressed gas 200 from the position inward of the protrusion portions 151 in the axial direction which are disposed at both end portions in the axial direction among the plurality of protrusion portions 151 is formed in the inner peripheral surface 160a of the fixed portion 160 that surrounds the plurality of protrusion portions 151. Therefore, the compressed gas supplied from the gas supply hole 161 to an inside of the fixed portion 160 flows to both the roll cleaning member 61 side and a bearing portion 130 side, and thus serves as a gas curtain that prevents not only entry of liquid droplets and particles from the roll cleaning member 61 side but also entry of foreign matter generated from the bearing portion 130 side. Therefore, it is possible to seal the periphery of the shaft portion 110 in a non-contact manner while suppressing the entry of foreign matter and the generation of particles such as abrasive powder, and to reduce a rotational resistance of the roll cleaning member 61.

As described above, the substrate cleaning device 31 according to the present embodiment described above includes: the roll cleaning member 61 that scrubs the substrate W; and the rotation holding portion 100 that holds the end portion of the roll cleaning member 61 in the axial direction, in which the rotation holding portion 100 includes the shaft portion 110 connected to the end portion of the roll cleaning member 61 in the axial direction, the housing portion 120 that surrounds the shaft portion 110, the bearing portion 130 that is disposed inside the housing portion 120 and rotatably supports the shaft portion 110, and the non-contact sealing portion 140 that is disposed between the bearing portion 130 and the roll cleaning member 61 to seal the gap between the shaft portion 110 and the housing portion 120, and the non-contact sealing portion 140 includes the rotating portion 150 that is attached to the shaft portion 110 and has the plurality of protrusion portions 151 formed on the peripheral surface 150a of the rotating portion 150 at intervals in the axial direction, and the fixed portion 160 that is attached to the housing portion 120, surrounds the plurality of protrusion portions 151, and has the gas supply hole 161 formed in the inner peripheral surface 160a of the fixed portion 160 surrounding the plurality of protrusion portions 151, the gas supply hole 161 supplying the compressed gas 200 from the position inward of the protrusion portions 151 in the axial direction, which are disposed at both end portions in the axial direction among the plurality of protrusion portions 151. According to this configuration, it is possible to reduce the rotational resistance of the roll cleaning member 61 and suppress the generation of particles.

In addition, in the present embodiment, the gas supply hole 161 supplies the compressed gas 200 from the position including the center portion of the formation region A of the plurality of protrusion portions 151 in the axial direction. According to this configuration, since the compressed gas supplied from the gas supply hole 161 to the inside of the fixed portion 160 substantially evenly flows to the roll cleaning member 61 side and the bearing portion 130 side, an effect of the gas curtain is enhanced.

In addition, in the present embodiment, as shown in FIG. 8, the gas supply hole 161 is open to the inner peripheral surface 160a of the fixed portion 160 in the direction parallel to the tangential direction of the peripheral surface 150a of the rotating portion 150. According to this configuration, the compressed gas 200 can flow around the rotating portion 150 in a circumferential manner.

In addition, in the present embodiment, the gas exhaust hole 166 for exhausting the compressed gas 200 is formed in the inner peripheral surface 160a of the fixed portion 160 on the same side as the gas supply hole 161. According to this configuration, the compressed gas 200 flowing around the rotating portion 150 in a circumferential manner can be easily discharged from the gas exhaust hole 166.

In addition, in the present embodiment, as shown in FIG. 7, the fixed portion 160 includes the first wall portion 163 that is disposed closer to the roll cleaning member 61 side than the plurality of protrusion portions 151 in the axial direction, extends radially inward beyond the tip of the protrusion portion 151 disposed at the end portion on the roll cleaning member 61 side among the plurality of protrusion portions 151, and faces the peripheral surface 150a of the rotating portion 150 with the gap, and the second wall portion 164 that is disposed closer to the roll cleaning member 61 side than the first wall portion 163 in the axial direction, and covers the gap between the first wall portion 163 and the peripheral surface 150a of the rotating portion 150 when viewed in the axial direction. According to this configuration, the second wall portion 164 serves as a waterproof wall, and it is possible to prevent droplets from the roll cleaning member 61 side from infiltrating into the labyrinth of the non-contact sealing portion 140 through the gap between the first wall portion 163 and the peripheral surface 150a of the rotating portion 150.

In addition, in the present embodiment, the drainage hole 165 is formed in the inner peripheral surface 160a of the fixed portion 160 between the first wall portion 163 and the second wall portion 164. According to this configuration, even if several droplets of a liquid ride over the second wall portion 164, the liquid can be discharged to the outside from the drainage hole 165 in the bottom portion before reaching the first wall portion 163.

In addition, the substrate processing device 1 according to the present embodiment includes the polishing unit 20 that polishes the substrate W and the cleaning unit 30 that cleans the substrate W polished in the polishing unit 20, in which the cleaning unit 30 includes the substrate cleaning device 31 described above. According to this configuration, it is possible to reduce the rotational resistance of the roll cleaning member 61 and suppress the generation of particles.

The substrate cleaning device 31 can adopt the following configuration.

Figure 9:
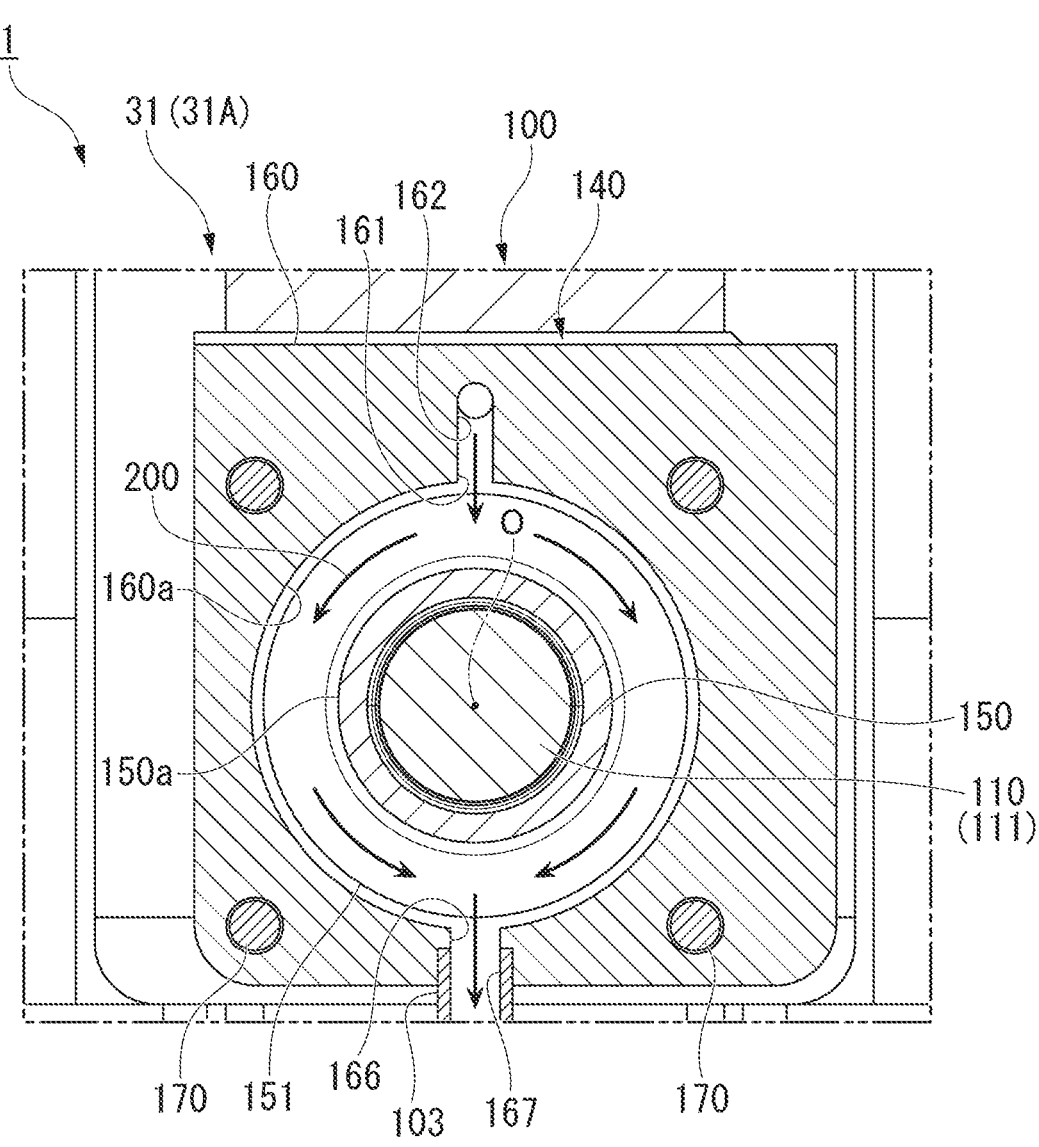
FIG. 9 is a cross-sectional view showing a modification example of disposition of a gas supply hole and a gas exhaust hole of the non-contact sealing portion according to the embodiment.

FIG. 9 is a cross-sectional view showing a modification example of the disposition of the gas supply hole 161 and the gas exhaust hole 166 of the non-contact sealing portion 140 according to the embodiment.

The gas supply hole 161 shown in FIG. 9 is open toward a center axis O of the rotating portion 150. According to this configuration, the compressed gas 200 supplied from the gas supply hole 161 can flow substantially evenly to both sides of the fixed portion 160 in the circumferential direction.

In addition, the gas exhaust hole 166 shown in FIG. 9 is formed in the inner peripheral surface 160a of the fixed portion 160 on a side opposite to the gas supply hole 161. According to this configuration, since the compressed gas 200 can be exhausted at confluence point of flows of the compressed gas 200 that have flowed to both sides of the fixed portion 160 in the circumferential direction, it is possible to suppress a decrease in gas fluidity caused by a collision of the flows of the compressed gas 200.

Figure 10:
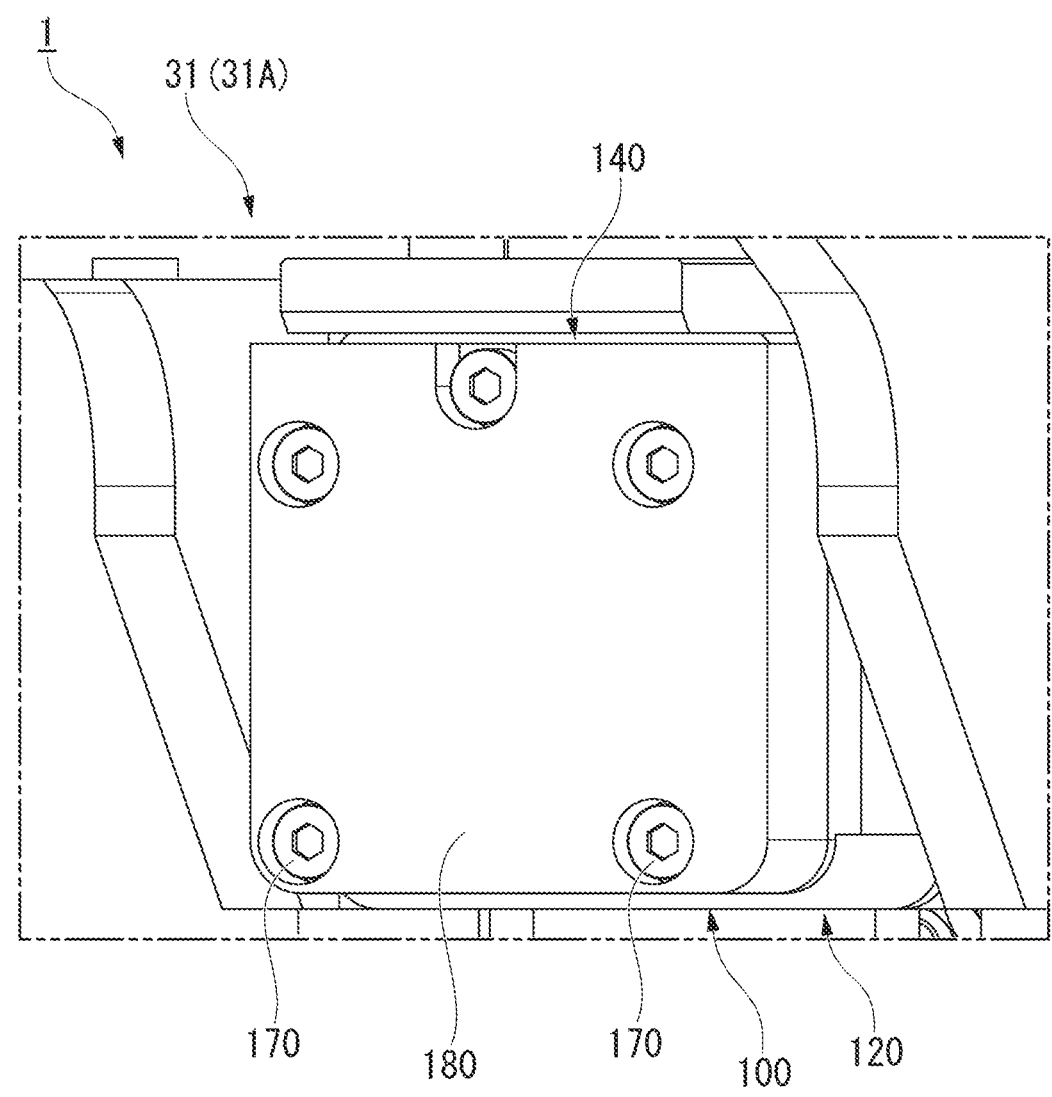
FIG. 10 is a perspective view showing a form of the rotation holding portion during maintenance of the substrate cleaning device according to the embodiment.

FIG. 10 is a perspective view showing a form of the rotation holding portion 100 during maintenance of the substrate cleaning device 31 according to the embodiment.

As shown in FIG. 10, during the maintenance of the substrate cleaning device 31, the fixed portion 160 of the non-contact sealing portion 140 is removed from the housing portion 120, and instead, a cover 180 surrounding the rotating portion 150 is attached thereto.

A fixing position at which the cover 180 is fixed to the housing portion 120 by bolts 170 is the same as a fixing position of the fixed portion 160 (see FIG. 5) so that the cover 180 is attached as it is to an attachment place of the fixed portion 160. As described above, according to the maintenance method for the substrate cleaning device 31, in which maintenance is performed in a state in which, after the fixed portion 160 is removed from the housing portion 120, the cover 180 surrounding the rotating portion 150 is attached to a place from which the fixed portion 160 is removed, it is possible to stop the supply of the compressed gas to the non-contact sealing portion 140, to clean an inside of a module in a state before the roll cleaning member 61 is attached.

The preferred embodiments of the present invention described above are exemplary. The scope of the present invention should not be construed as being limited to these embodiments. Additions, omissions, substitutions, and other modifications of technical features for the embodiments can be made without departing from the scope of the present invention. The present invention should not be considered as being limited by the foregoing description, but rather is specified as set forth in the claims.

For example, as shown in FIG. 8, even in the case where the gas supply hole 161 is open to the inner peripheral surface 160a of the fixed portion 160 in the direction parallel to the tangential direction of the peripheral surface 150a of the rotating portion 150, as shown in FIG. 9, the gas exhaust hole 166 may be formed in the inner peripheral surface 160a of the fixed portion 160 on a side opposite to the gas supply hole 161.

In addition, as shown in FIG. 9, even in the case where the gas supply hole 161 is open toward the center axis O of the rotating portion 150, as shown in FIG. 8, the gas exhaust hole 166 may be formed in the inner peripheral surface 160a of the fixed portion 160 on the same side as the gas supply hole 161.

REFERENCE SIGNS LIST

1: Substrate processing device
20: Polishing unit
30: Cleaning unit
31: Substrate cleaning device
61: Roll cleaning member
100: Rotation holding portion
110: Shaft portion
120: Housing portion
130: Bearing portion
140: Non-contact sealing portion
150: Rotating portion
150a: Peripheral surface
151: Protrusion portion
160: Fixed portion
160a: Inner peripheral surface
161: Gas supply hole
163: First wall portion
164: Second wall portion
165: Drainage hole
166: Gas exhaust hole
180: Cover
200: Compressed gas
A: formation region
O: Center axis
W: Substrate

The invention claimed is:

1. A substrate cleaning device comprising:
a roll cleaning member configured to scrub a substrate; and
a rotation holding portion configured to hold an end portion of the roll cleaning member in an axial direction,
wherein the rotation holding portion includes
a shaft portion configured to be connected to the end portion of the roll cleaning member in the axial direction,
a housing portion configured to surround the shaft portion,
a bearing portion configured to be disposed inside the housing portion and to rotatably support the shaft portion, and
a non-contact sealing portion configured to be disposed between the bearing portion and the roll cleaning member and to seal a gap between the shaft portion and the housing portion, and the non-contact sealing portion includes
a rotating portion configured to be attached to the shaft portion and to have a plurality of protrusion portions formed on a peripheral surface of the rotating portion at intervals in the axial direction, and
a fixed portion configured to be attached to the housing portion, to surround the plurality of protrusion portions, and to have a gas supply hole formed in an inner peripheral surface of the fixed portion surrounding the plurality of protrusion portions, the gas supply hole supplying a compressed gas from a position inward of the protrusion portions in the axial direction, which are disposed at both end portions in the axial direction, among the plurality of protrusion portions.

2. The substrate cleaning device according to claim 1, wherein the gas supply hole supplies the compressed gas from a position including a center portion of a formation region of the plurality of protrusion portions in the axial direction.

3. The substrate cleaning device according to claim 1, wherein the gas supply hole is open to the inner peripheral surface of the fixed portion in a direction parallel to a tangential direction of the peripheral surface of the rotating portion.

4. The substrate cleaning device according to claim 1, wherein the gas supply hole is open toward a center axis of the rotating portion.

5. The substrate cleaning device according to claim 1, wherein a gas exhaust hole for exhausting the compressed gas is formed in the inner peripheral surface of the fixed portion on a side opposite to the gas supply hole.

6. The substrate cleaning device according to claim 1, wherein a gas exhaust hole for exhausting the compressed gas is formed on the inner peripheral surface of the fixed portion on the same side as the gas supply hole.

7. The substrate cleaning device according to claim 1, wherein the fixed portion includes a first wall portion configured to be disposed closer to a roll cleaning member side than the plurality of protrusion portions in the axial direction, to extend radially inward beyond a tip of the protrusion portion disposed at an end portion on the roll cleaning member side among the plurality of protrusion portions, and to face the peripheral surface of the rotating portion with a gap, and a second wall portion configured to be disposed closer to the roll cleaning member side than the first wall portion in the axial direction, and to cover the gap between the first wall portion and the peripheral surface of the rotating portion when viewed in the axial direction.

8. The substrate cleaning device according to claim 7, wherein a drainage hole is formed in the inner peripheral surface of the fixed portion between the first wall portion and the second wall portion.

16

9. A substrate processing device comprising:
a polishing unit configured to polish a substrate; and
a cleaning unit configured to clean the substrate polished in the polishing unit,
wherein the cleaning unit includes the substrate cleaning device according to claim 1.

10. A maintenance method for a substrate cleaning device,
in which the substrate cleaning device includes
a roll cleaning member configured to scrub a substrate, and
a rotation holding portion configured to hold an end portion of the roll cleaning member in an axial direction,
the rotation holding portion includes
a shaft portion configured to be connected to the end portion of the roll cleaning member in the axial direction,
a housing portion configured to surround the shaft portion,
a bearing portion configured to be disposed inside the housing portion and to rotatably support the shaft portion, and
a non-contact sealing portion configured to be disposed between the bearing portion and the roll cleaning member to seal a gap between the shaft portion and the housing portion, and
the non-contact sealing portion includes
a rotating portion configured to be attached to the shaft portion and to have a plurality of protrusion portions formed on a peripheral surface of the rotating portion at intervals in the axial direction, and
a fixed portion configured to be attached to the housing portion, to surround the plurality of protrusion portions, and to have a gas supply hole formed in an inner peripheral surface of the fixed portion surrounding the plurality of protrusion portions, the gas supply hole supplying a compressed gas from a position inward of the protrusion portions in the axial direction, which are disposed at both end portions in the axial direction, among the plurality of protrusion portions, the method comprising:
performing maintenance in a state in which, after the fixed portion is removed from the housing portion, a cover surrounding the rotating portion is attached to a place from which the fixed portion is removed.

* * * * *